(12) United States Patent
Otsuki et al.

(10) Patent No.: US 12,518,965 B2
(45) Date of Patent: Jan. 6, 2026

(54) FILM FORMING METHOD AND FILM FORMING APPARATUS

(71) Applicant: Tokyo Electron Limited, Tokyo (JP)

(72) Inventors: Yuji Otsuki, Albany, NY (US); Munehito Kagaya, Nirasaki (JP); Yusuke Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 600 days.

(21) Appl. No.: 17/931,936

(22) Filed: Sep. 14, 2022

(65) Prior Publication Data
US 2023/0077599 A1    Mar. 16, 2023

(30) Foreign Application Priority Data
Sep. 16, 2021 (JP) .................. 2021-150819

(51) Int. Cl.
*H01L 21/02* (2006.01)
*C23C 16/34* (2006.01)
*C23C 16/455* (2006.01)
*H01J 37/32* (2006.01)

(52) U.S. Cl.
CPC ........ *H01L 21/0228* (2013.01); *C23C 16/345* (2013.01); *C23C 16/45536* (2013.01); *C23C 16/45553* (2013.01); *H01J 37/32449* (2013.01); *H01L 21/0217* (2013.01); *H01L 21/02274* (2013.01); *H01J 2237/332* (2013.01)

(58) Field of Classification Search
None
See application file for complete search history.

(56) References Cited

FOREIGN PATENT DOCUMENTS

| JP | 2018-137369 A | 8/2018 |
|---|---|---|
| KR | 10-2018-0007679 A | 1/2018 |

*Primary Examiner* — Alexander G Ghyka
(74) *Attorney, Agent, or Firm* — Armstrong Teasdale LLP

(57) ABSTRACT

There is provided a film forming method of forming a film in a recess formed on a surface of a substrate. The film forming method includes: forming an adsorption-inhibiting region by supplying an adsorption-inhibiting gas to the substrate; adsorbing a silicon-containing gas to a region other than the adsorption-inhibiting region by supplying the silicon-containing gas to the substrate; and forming a silicon nitride film by exposing the substrate to a nitrogen-containing gas so that the nitrogen-containing gas reacts with the adsorbed silicon-containing gas, wherein the adsorbing the silicon-containing gas includes controlling a dose amount of the silicon-containing gas to be supplied to be equal to or greater than an adsorption saturation amount of the silicon-containing gas to be adsorbed on the substrate on which no adsorption-inhibiting region is formed.

10 Claims, 8 Drawing Sheets

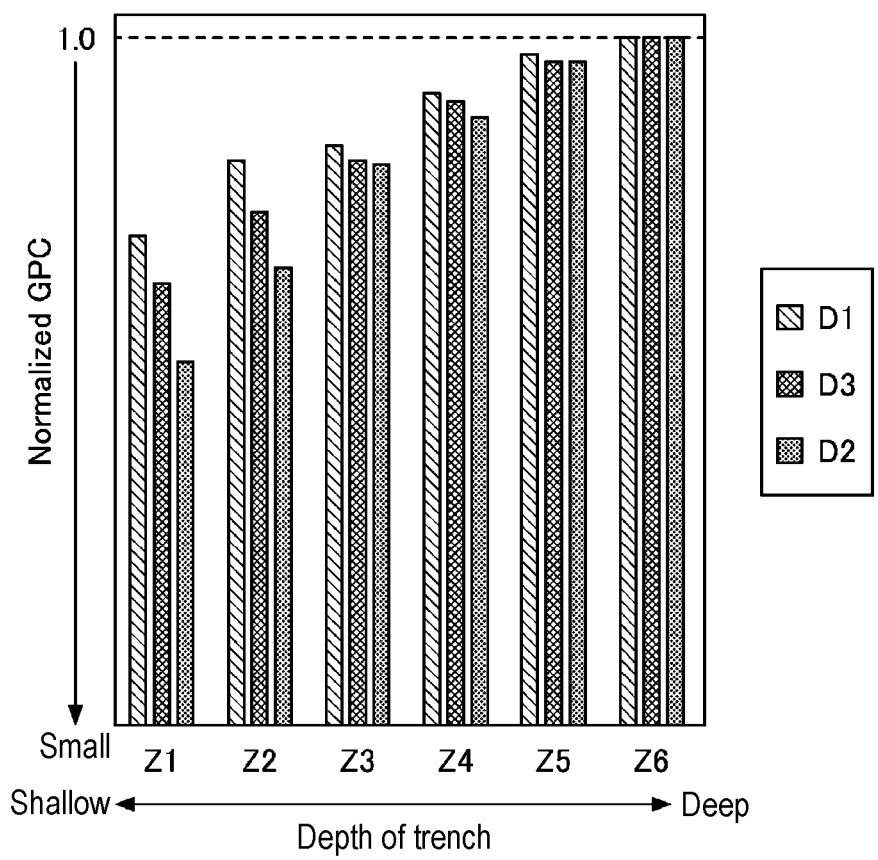

FILM FORMING METHOD AND FILM FORMING APPARATUS

CROSS-REFERENCE TO RELATED APPLICATION

This application is based upon and claims the benefit of priority from Japanese Patent Application No. 2021-150819, filed on Sep. 16, 2021, the entire contents of which are incorporated herein by reference.

TECHNICAL FIELD

The present disclosure relates to a film forming method and a film forming apparatus.

BACKGROUND

There is a need to embed a film in a recess formed on a substrate without generating a void (hole). Meanwhile, due to the miniaturization and complexity of a device structure, it is difficult to embed a film without generating a void. For example, when the side wall of a recess has a bowing shape, it is difficult to prevent a void from being generated in a film simply by forming a conformal film in the recess.

Therefore, a method of controlling a film formation shape by using an adsorption-inhibiting gas has been proposed (e.g., Patent Document 1). In Patent Document 1, the adsorption-inhibiting gas is adsorbed in the vicinity of the opening of the top of a recess. As a result, a growth per cycle (GPC) at the top of the recess is made to be smaller than a GPC at the bottom portion of the recess, thereby suppressing deposition of a film in the vicinity of the opening at the top, so that blocking of the opening can be prevented and a film can be embedded in a bottom-up manner from the bottom portion of the recess.

PRIOR ART DOCUMENT

Patent Document

Patent Document 1: Japanese Laid-Open Publication No. 2018-137369

SUMMARY

According to one embodiment of the present disclosure, there is provided a film forming method of forming a film in a recess formed on a surface of a substrate. The film forming method includes: forming an adsorption-inhibiting region by supplying an adsorption-inhibiting gas to the substrate; adsorbing a silicon-containing gas to a region other than the adsorption-inhibiting region by supplying the silicon-containing gas to the substrate; and forming a silicon nitride film by exposing the substrate to a nitrogen-containing gas so that the nitrogen-containing gas reacts with the adsorbed silicon-containing gas, wherein the adsorbing the silicon-containing gas includes controlling a dose amount of the silicon-containing gas to be supplied to be equal to or greater than an adsorption saturation amount of the silicon-containing gas to be adsorbed on the substrate on which no adsorption-inhibiting region is formed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 10 is a diagram showing GPCs obtained by normalizing the evaluation results of FIG. 9 at the position Z6.

DETAILED DESCRIPTION

Figure 1A:
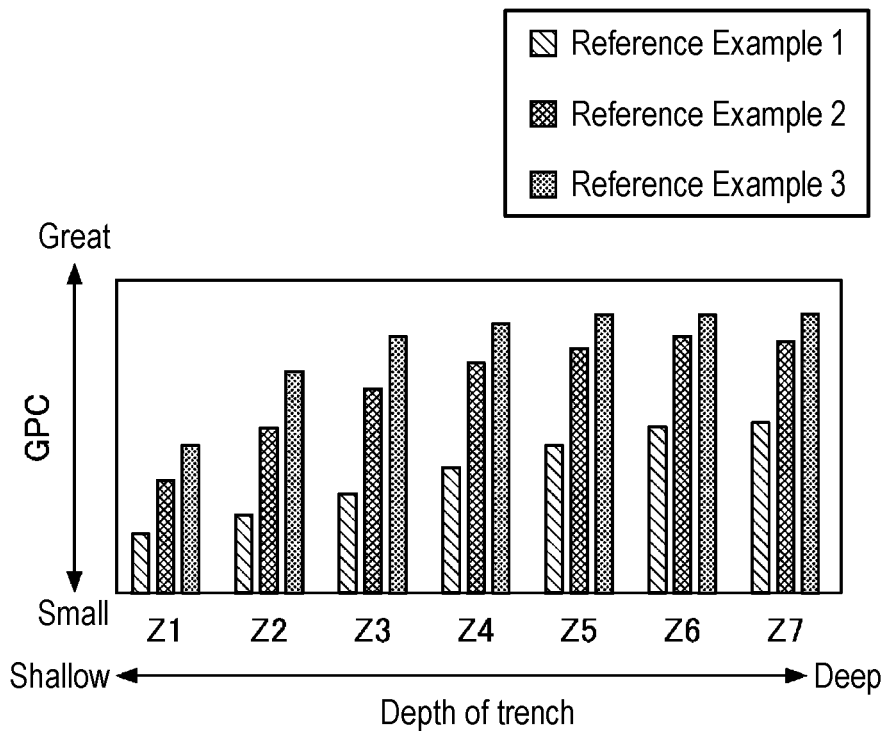
FIGS. 1A and 1B are diagrams showing evaluation results of embedding characteristics of silicon nitride films according to reference examples.

Reference will now be made in detail to various embodiments, examples of which are illustrated in the accompanying drawings. In each drawings, the same or corresponding components may be denoted by the same reference numerals, and a description thereof may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Controlling of Film Formation Shape Using Adsorption-Inhibiting Gas]

There is a film forming method in which a film formation shape is controlled by using an adsorption-inhibiting gas in order to embed a film in a recess formed on a substrate without forming a void (hole). For example, in the film formation of a silicon nitride film (SiN film) through an atomic layer deposition (ALD) method, a silicon-containing gas such as dichlorosilane gas (DCS) is used as a raw material gas, and a nitrogen-containing gas such as ammonia gas ($NH_3$) is used to nitride the silicon-containing gas. In this case, by using chlorine gas ($Cl_2$) as an adsorption-inhibiting gas, bottom-up film formation becomes possible without generation of a void.

An example of a film formation method through an ALD method will be described as a reference example. A silicon wafer is used as an example of a wafer W, and a trench is formed on the silicon wafer as a recess. In addition, the inner portion of the trench and the surface of the wafer W are made of, for example, silicon or an insulating film, and may partially include a metal or a metal compound.

In the reference example, chlorine gas is supplied to the wafer W. The chlorine gas is an example of the adsorption-inhibiting gas. The chlorine gas is adsorbed at an upper portion of the trench formed in the wafer W and the vicinity of the upper portion in an amount larger than the amount adsorbed at the bottom portion of the trench and the vicinity of the bottom portion. Therefore, the inhibition effect is high at the upper portion of the trench where the adsorbed amount of chlorine gas is large, and low at the bottom portion where the adsorbed amount of chlorine gas is small. That is, the upper portion of the trench becomes the adsorption-inhibiting region, and the bottom portion becomes the region other than the adsorption-inhibiting region. The adsorption-inhibiting region includes a region having a relatively high adsorption-inhibiting effect in the recess of the trench, and the region other than the adsorption-inhibiting region includes a region having a relatively low adsorption-inhibiting effect in the recess.

After forming the adsorption-inhibiting region with the chlorine gas, the chlorine gas is purged. Next, a silicon-containing gas (e.g., DCS) is supplied as a silicon precursor to adsorb the silicon-containing gas in the trench to form a silicon (Si)-containing layer. The silicon-containing gas is less likely to be adsorbed in the adsorption-inhibiting region, and the silicon-containing gas is likely to be adsorbed in the region other than the adsorption-inhibiting region. Therefore, the adsorbed amount of the silicon-containing gas is larger at the bottom portion of the trench than at the upper portion of the trench.

Next, after purging the silicon-containing gas, a nitrogen-containing gas (e.g., ammonia gas) is supplied to nitride the silicon-containing layer with the nitrogen-containing gas so as to form a silicon nitride film. This makes it possible to form a silicon nitride film thicker at the bottom portion of the trench than at the upper portion of the trench. Next, after purging the nitrogen-containing gas, the process returns to the step of supplying chlorine gas to the wafer on which the trench is formed. By repeating the steps of supplying chlorine gas, purging the chlorine gas, supplying a silicon-containing gas, purging the silicon-containing gas, supplying a nitrogen-containing gas supply, and purging the nitrogen-containing gas in this order, a silicon nitride film is formed at an atomic layer level. As a result, bottom-up film formation without generating a void is enabled, and embedding performance is improved.

The difference in the inhibiting effect between the upper portion and the bottom portion of the trench by the adsorption-inhibiting gas may be shown by the difference in growth per cycle (GPC) between the upper portion and the bottom portion. The GPC is the amount of a film formed per cycle of the ALD method. The larger the difference in GPC, highly difficult embedding in a trench structure such as a fine trench or a bowing shape trench is enabled.

Figure 1B:
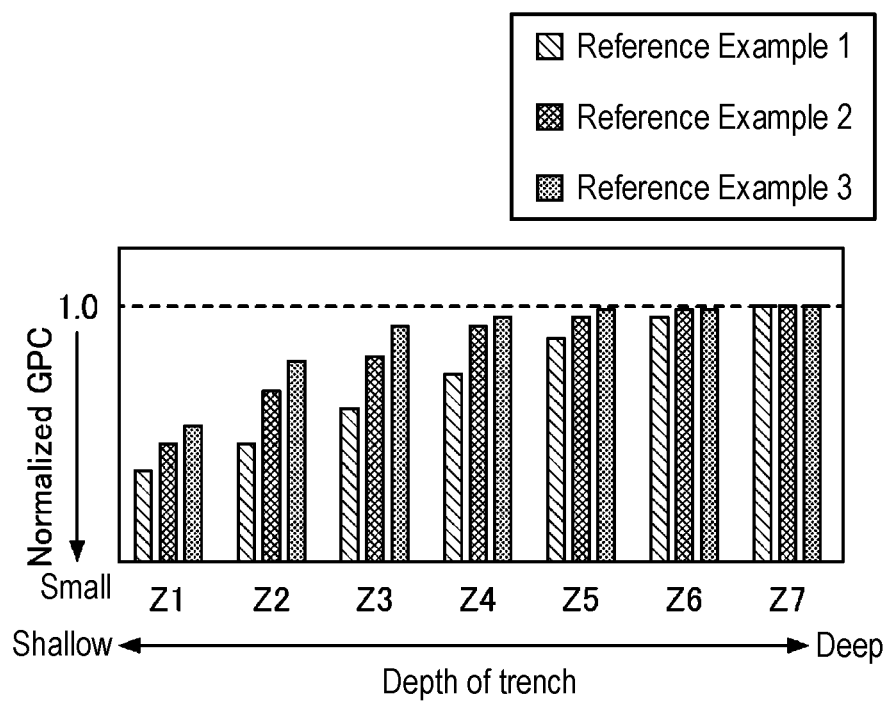

FIGS. 1A and 1B are diagrams showing evaluation results of embedding characteristics of silicon nitride films according to reference examples. Reference Examples 1 to 3 show changes of GPCs depending on the depths of trenches when the supply time (sec) of the adsorption-inhibiting gas is controlled to different values in the adsorption-inhibiting gas supply step. The dose amount (Langmuir) of a gas is a value indicated by the partial pressure x the supply time of the gas. For example, if the gas supply time is constant, the dose amount increases as the partial pressure of the gas increases. In addition, for example, if the partial pressure of the gas is constant, the dose amount increases as the gas supply time increases. As a condition for this evaluation, the partial pressures of the adsorption-inhibiting gases were controlled to the same pressure in all of Reference Examples 1 to 3. Then, among Reference Examples 1 to 3, with respect to the dose amount of Reference Example 2, the dose amount of the adsorption-inhibiting gas was increased in Reference Example 1 and the dose amount was decreased the most in Reference Example 3.

In FIG. 1A, among the positions Z1 to Z7, the position Z1 is the shallowest position, that is, the position of the upper portion in the trench, and the position Z7 is the deepest position, that is, the position of the bottom portion in the trench. Further, FIG. 1B shows GPC normalized at the position Z7 in all of Reference Examples 1 to 3 shown in FIG. 1A.

As shown in FIG. 1A, in each of Reference Examples 1 to 3, it can be seen that the GPC at the upper portion in the trench (the position where the trench depth is shallow) is smaller than the GPC at the bottom portion in the trench (the position where the trench depth is deepest). From this result, in each of Reference Examples 1 to 3, it was possible to control the cross section of the silicon nitride film embedded in the trench in a V shape. That is, it was shown that it is possible to form a film having a high bottom-up property so that embedding performance can be improved. In addition, as shown in FIG. 1B, as the dose amount of the adsorption-inhibiting gas was increased, the difference between the GPC at the upper portion in the trench and the GPC at the bottom portion in the trench became larger due to the adsorption inhibition of chlorine gas, and the embedding performance was improved.

From the foregoing, as the dose amount of the adsorption-inhibiting gas is increased, the film thickness at the upper portion in the trench is relatively smaller than the film thickness at the bottom portion due to the adsorption-inhibiting effect as shown in FIG. 1B, so that it is possible to implement film formation in a high bottom-up property, eliminate the generation of a void, and improve the embedding performance. As the dose amount of the adsorption-inhibiting gas is increased, the GPCs are lowered as a whole so that productivity is lowered, as shown in FIG. 1A. As described above, in the film forming method of the reference examples, the trade-off between a film shape and a GPC, that is, the compatibility between the embedding performance and the productivity becomes an issue.

Therefore, the present embodiment provides a film forming method capable of achieving both improvement of embedding performance and improvement of productivity in embedding in a trench using an adsorption-inhibiting gas. Hereinafter, an example of the configuration of a film forming apparatus according to an embodiment will be described, and then a film forming method according to an embodiment that is capable of being executed by using the film forming apparatus will be described.

[Film Forming Apparatus]

Figure 2:
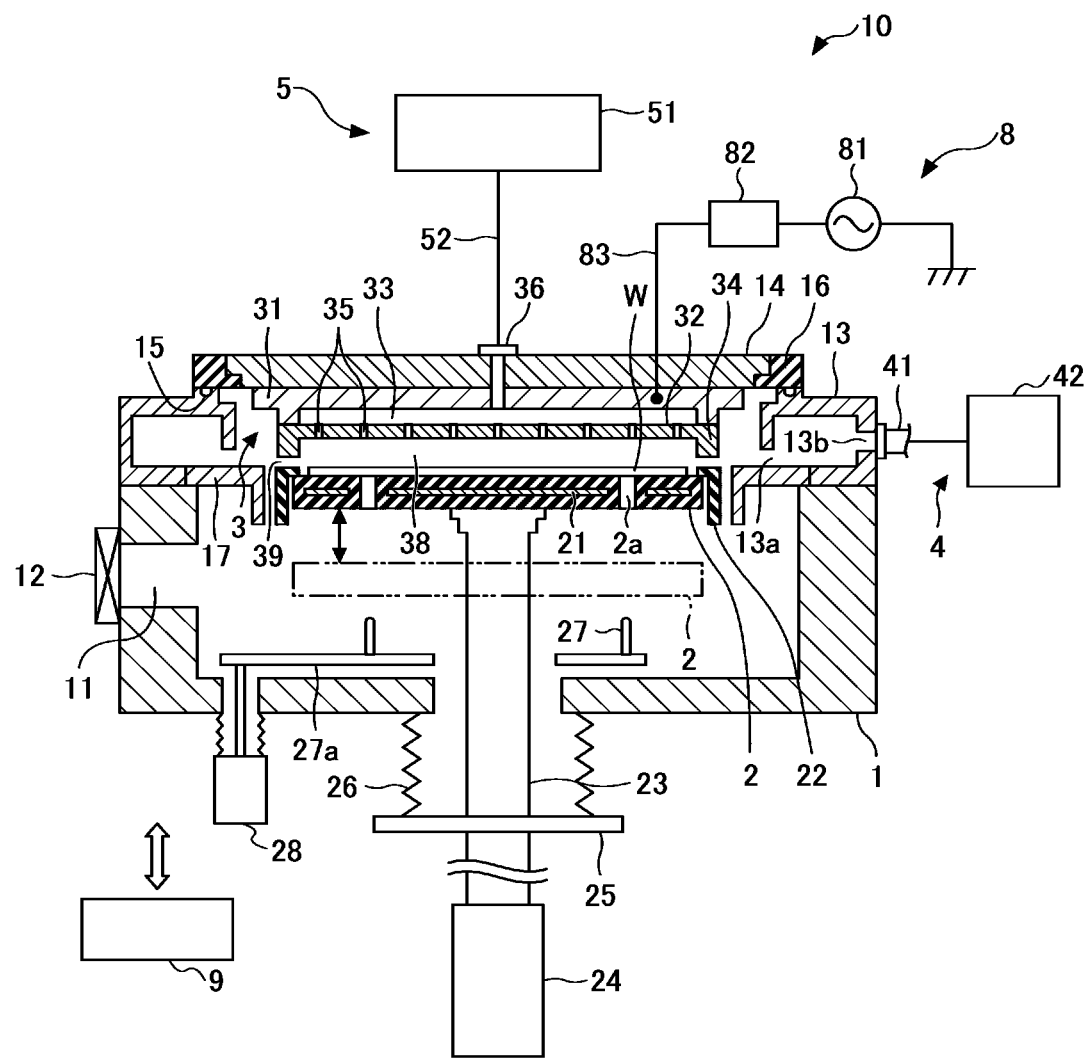
FIG. 2 is a schematic cross-sectional view illustrating an example of a film forming apparatus of an embodiment.

An example of a film forming apparatus 10 of an embodiment will be described with reference to FIG. 2. The film forming apparatus 10 includes a processing container 1, a stage 2, a shower head 3, an exhauster 4, a gas supplier 5, a RF power supplier 8, a controller 9, and the like.

The processing container 1 is made of a metal such as aluminum, and has a substantially cylindrical shape. A wafer W as an example of a substrate is accommodated in the processing container 1. A carry-in/out port 11 is formed in the side wall of the processing container 1 for carry-in or carry-out of a wafer W. The carry-in/out port 11 is opened or closed by a gate valve 12. An annular exhaust duct 13 having a rectangular cross section is installed on the main body of the processing container 1. A slit 13a is formed along the inner peripheral surface of the exhaust duct 13. An exhaust port 13b is formed in the outer wall of the exhaust duct 13.

On the top surface of the exhaust duct 13, a ceiling wall 14 is installed to close the upper opening of the processing container 1 via an insulator member 16. The space between the exhaust duct 13 and the insulator member 16 is hermetically sealed with a seal ring 15. A partition member 17 divides the interior of the processing container 1 into upper and lower portions when the stage 2 (and a cover member 22) is raised to a processing position.

The stage 2 horizontally supports the wafer W in the processing container 1. A support member 23 is installed in a bottom surface of the stage 2 to support the stage 2. The stage 2 is formed in a disk shape having a size corresponding to the wafer W, and is supported by a support member 23. The stage 2 is formed of a ceramic material such as AlN or a metal material such as aluminum or nickel alloy, and a heater 21 for heating a wafer W is embedded in the stage 2. The heater 21 generates heat by being fed with power from a heater power supply (not illustrated). Then, the wafer W is controlled to a predetermined temperature by controlling the output of the heater 21 by a temperature signal of a thermocouple (not illustrated) provided in the vicinity of the top surface of the stage 2. The stage 2 is provided with a cover member 22 formed of ceramic such as alumina so as to cover the outer peripheral region of the top surface and the side surface thereof.

The support member 23 extends to the lower side of the processing container 1 through a hole formed in the bottom wall of the processing container 1 from the center of the bottom surface of the stage 2, and the lower end of the support member 23 is connected to a lifting mechanism 24. The stage 2 is raised and lowered via the support member 23 by the lifting mechanism 24 between a processing position illustrated in FIG. 2 and a transport position indicated by the alternate long and two short dashes line below the processing position where the wafer W is capable of being transported. Below the processing container 1, a flange 25 is mounted on the support member 23. A bellows 26 is installed between the bottom surface of the processing container 1 and the flange 25. The bellows 26 partitions the atmosphere in the processing container 1 from the external air, and expands and contracts in response to the raised/lowered movement of the stage 2.

Three wafer support pins 27 (of which only two are illustrated) are provided in the vicinity of the bottom surface of the processing container 1 to protrude upward from a lifting plate 27a. The wafer support pins 27 are raised and lowered through the lifting plate 27a by the lifting mechanism 28 provided below the processing container 1. The wafer support pins 27 are inserted through the through holes 2a provided in the stage 2 located at the transport position and are configured to protrude and retract with respect to the top surface of the stage 2. By raising and lowering the wafer support pins 27, the wafer W is delivered between a transport mechanism (not illustrated) and the stage 2.

The shower head 3 supplies a processing gas into the processing container 1 in the form of a shower. The shower head 3 is made of a metal, is provided to face the stage 2, and has a diameter that is substantially the same as that of the stage 2. The shower head 3 includes a main body 31, a shower plate 32, and the like. The main body 31 is fixed to the ceiling wall 14 of the processing container 1. The shower plate 32 is connected under the main body 31. A gas diffusion space 33 is formed between the main body 31 and the shower plate 32. The gas diffusion space 33 is provided with a gas introduction hole 36 so as to penetrate the centers of the ceiling wall 14 and the main body 31. An annular protrusion 34 protruding downward is formed on the peripheral edge of the shower plate 32. Gas ejection holes 35 are formed in the flat portion inside the annular protrusion 34. In the state in which the stage 2 is at the processing position, a processing space 38 is formed between the stage 2 and the shower plate 32, and the top surface of the cover member 22 and the annular protrusion 34 are close to each other so as to form an annular gap 39.

The exhauster 4 evacuates the interior of the processing container 1. The exhauster 4 includes an exhaust pipe 41, an exhaust mechanism 42, and the like. The exhaust pipe 41 is connected to the exhaust port 13b. The exhaust mechanism 42 includes a vacuum pump connected to the exhaust pipe 41, a pressure control valve, and the like. During a process, the gas in the processing container 1 reaches the exhaust duct 13 via the slit 13a, and is exhausted from the exhaust port 13b through the exhaust pipe 41 by the exhaust mechanism 42.

The gas supplier 5 supplies various types of processing gases to the shower head 3. The gas supplier 5 includes a gas source 51, a gas line 52, and the like. The gas source 51 includes various processing gas sources, a mass flow controller, valves (none of which are illustrated), and the like. The various processing gases include gases to be used in a film forming method of an embodiment to be described later. The various processing gases include an adsorption-inhibiting gas, a silicon-containing gas, a nitrogen-containing gas, a purge gas, and the like. The various processing gases are introduced from the gas source 51 into the gas diffusion space 33 via the gas line 52 and the gas introduction hole 36.

The adsorption-inhibiting gas includes, for example, at least one of chlorine gas ($Cl_2$), nitrogen gas ($N_2$), and a mixed gas of chlorine gas and nitrogen gas ($Cl_2/N_2$). The silicon-containing gas includes, for example, dichlorosilane gas (DCS). The nitrogen-containing gas includes, for example, at least one of ammonia gas ($NH_3$) and a mixed gas ($NH_3/Ar$) of ammonia gas and argon gas (Ar). The purge gas includes, for example, argon gas.

The film forming apparatus 10 is a capacitively coupled plasma apparatus, in which the stage 2 functions as a lower electrode and the shower head 3 functions as an upper electrode. The stage 2 is grounded via a capacitor (not illustrated). However, the stage 2 may be grounded without, for example, via a capacitor, or may be grounded via a circuit in which a capacitor and a coil are combined. The shower head 3 is connected to an RF power supplier 8.

The RF power supplier 8 supplies radio-frequency power (hereinafter, also referred to as "RF power") to the shower head 3. The RF power supplier 8 includes an RF power supply 81, a matcher 82, a feeding line 83, and the like. The RF power supply 81 is a power supply that generates RF power. The RF power has a frequency suitable for plasma generation. The frequency of the RF power is, for example, a frequency in the range of 450 KHz in the low-frequency band to 2.45 GHz in the microwave band. The RF power supply 81 is connected to the main body 31 of the shower head 3 via the matcher 82 and the feeding line 83. The matcher 82 has a circuit for matching a load impedance with the internal impedance of the RF power supply 81. The RF power supplier 8 has been described as supplying RF power to the shower head 3 which serves as the upper electrode, but the disclosure is not limited thereto. RF power may be supplied to the stage 2 which serves as the lower electrode.

The controller 9 is, for example, a computer, and includes a central processing unit (CPU), a random access memory (RAM), a read only memory (ROM), an auxiliary storage device, and the like. The CPU operates based on a program stored in the ROM or an auxiliary storage device, and controls the operation of the film forming apparatus 10. The controller 9 may be provided either inside or outside the film forming apparatus 10. In the case where the controller 9 is provided outside the film forming apparatus 10, the controller 9 controls the film forming apparatus 10 via a wired or wireless communication mechanism.

[Film Forming Method]

Figure 3:
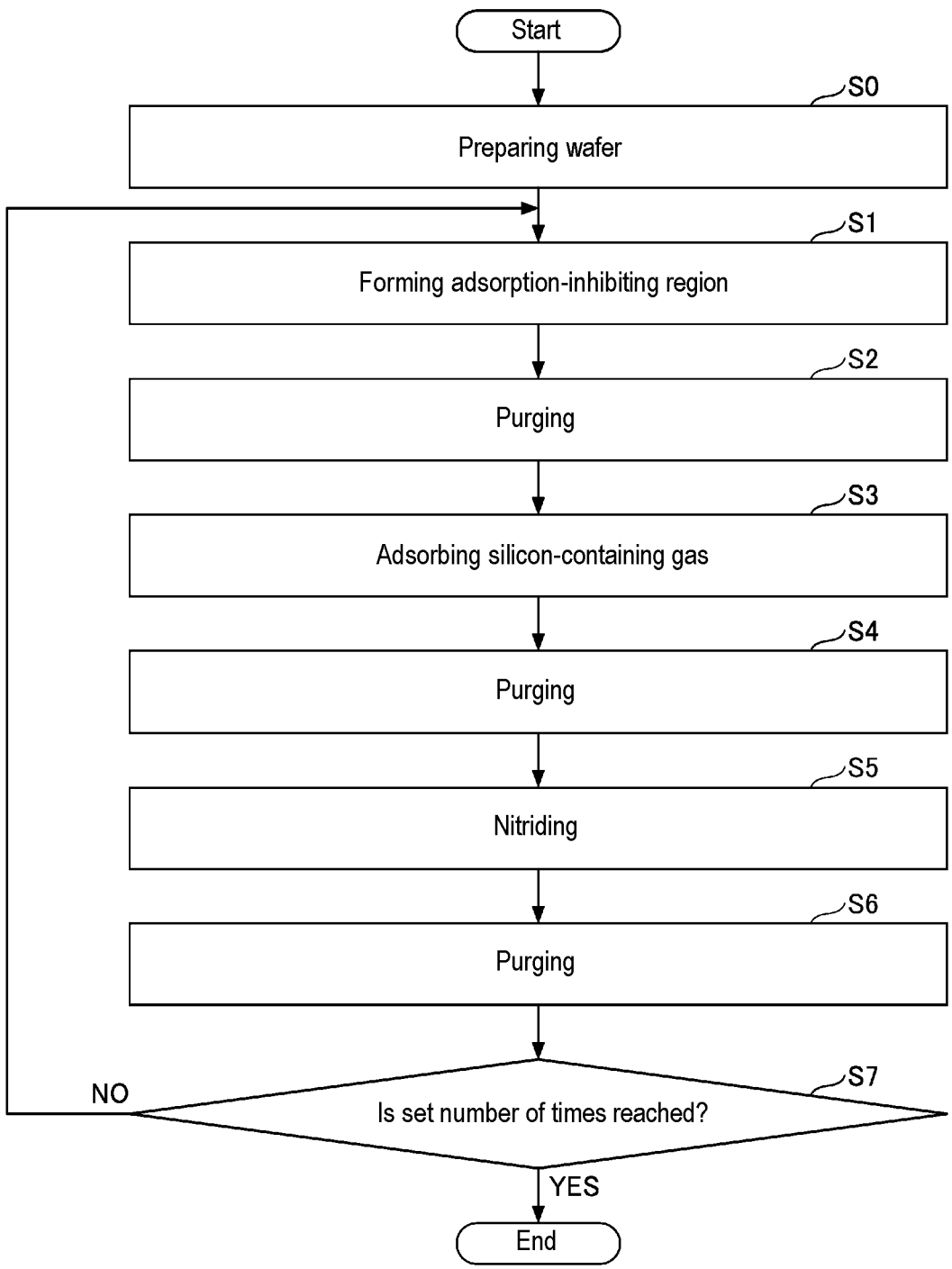
FIG. 3 is a flowchart illustrating an example of a film forming method of an embodiment.
Figure 4:
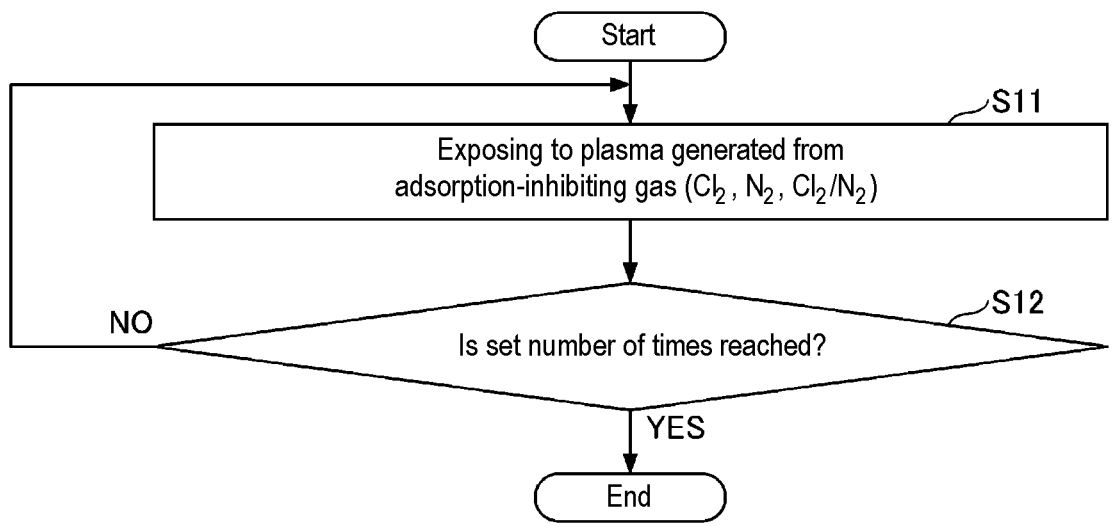
FIG. 4 is a flowchart illustrating an example of a step of forming an adsorption-inhibiting region of FIG. 2.

Next, with reference to FIGS. 3 and 4, an example of a film forming method of an embodiment will be described when the film forming apparatus 10 is used. First, the controller 9 prepares a wafer W by carrying a wafer W having a trench formed on the surface thereof into the processing container 1 and placing the wafer W on the stage 2 (step SO). The controller 9 opens the gate valve 12 in the state in which the stage 2 is lowered to the transport position by controlling the lifting mechanism 24. Subsequently, by a transport arm (not illustrated), the wafer W is carried into the processing container 1 through the carry-in/out port 11 and placed on the stage 2 that is heated to a predetermined temperature (e.g., 600 degrees C. or lower) by the heater 21. Subsequently, the controller 9 controls the lifting mechanism 24 to raise the stage 2 to the processing position, and depressurizes the interior of the processing container 1 to a predetermined degree of vacuum by the exhaust mechanism 42.

(Step S1 of Forming Adsorption-Inhibiting Region)

Subsequently, step S1 for forming an adsorption-inhibiting region is performed. In the step S1 of forming the adsorption-inhibiting region, the wafer W is exposed to the plasma generated from an adsorption-inhibiting gas to form an adsorption-inhibiting region at the upper portion in the trench and on the surface of the wafer W. The adsorption-inhibiting region is a region that inhibits the adsorption of the silicon-containing gas. As illustrated in FIG. 4, the step S1 for forming the adsorption-inhibiting region includes, for example, steps S11 and S12.

In step S11, the wafer W is exposed to plasma generated from the adsorption-inhibiting gas to form the adsorption-inhibiting region mainly at the upper portion in the trench and on the surface of the wafer W. In the present embodiment, the controller 9 supplies $Cl_2$, $N_2$, or $Cl_2/N_2$ from the gas supplier 5 into the processing container 1 via the shower head 3, and then supplies RF power to the shower head 3 by the RF power supplier 8. As a result, plasma is generated from $Cl_2$, $N_2$, or $Cl_2/N_2$ in the processing container 1, and active species (reaction species) such as chlorine radicals, chlorine ions, nitrogen radicals, and nitrogen ions are generated in the trench formed on the surface of the wafer W. The active species are physically or chemically adsorbed on the surface. Since the adsorbed active species have a function of inhibiting the adsorption of a silicon-containing gas (e.g., DCS) in step S3 of adsorbing the silicon-containing gas described later, the region where the active species are adsorbed becomes an adsorption-inhibiting region with respect to the silicon-containing gas. Here, the active species easily reach the surface of the wafer W or the upper portion in the trench, but do not reach so much the inner portion of the trench, that is, the lower portion near the bottom portion. Due to the high aspect ratio of the trench, many active species are adsorbed or inactivated before reaching the inner portion of the trench. Therefore, the active species are adsorbed at a high density on the surface of the wafer W and the upper portion in the trench. However, in the lower portion in the trench, many unadsorbed portions remain and the density of the adsorbed active species becomes low.

In step S12, the controller 9 determines whether or not the number of times of performing step S11 has reached the set number of times. The set number of times may be one or more. When it is determined in step S12 that the number of times of performing step S11 has reached the set number of times, the step S1 of forming the adsorption-inhibiting region is terminated. Meanwhile, when it is determined in step S12 that the number of times of performing step S11 has not reached the set number of times, the process returns to step S11. In addition, a purge step of removing the gas remaining in the processing container 1 after step S11 may be performed between step S11 and step S12.

In step S1 of forming the adsorption-inhibiting region, by repeating the exposing of the wafer W to plasma generated from $Cl_2$, $N_2$, or $Cl_2/N_2$ (step S11) the set number of times, an adsorption-inhibiting region is formed at the upper portion in the trench and on the surface of the wafer W. At this time, in each of repeated steps S11, the type of the adsorption-inhibiting gas may be the same or different.

For example, when the set number of times is two, $Cl_2$ may be selected for the first time, and $Cl_2$, $N_2$, or $Cl_2/N_2$ may be selected for the second time. In this case, step S1 of forming the adsorption-inhibiting region includes exposing the wafer W to plasma generated from $Cl_2$ and then exposing the wafer W to plasma generated from $Cl_2$, $N_2$, or $Cl_2/N_2$. In addition, for example, $N_2$ may be selected for the first time, and $Cl_2$, $N_2$, or $Cl_2/N_2$ may be selected for the second time. In this case, step S1 of forming the adsorption-inhibiting region includes exposing the wafer W to plasma generated from $N_2$ and then exposing the wafer W to plasma generated from $Cl_2$, $N_2$, or $Cl_2/N_2$. In addition, for example, $Cl_2/N_2$ may be selected for the first time, and $Cl_2$, $N_2$, or $Cl_2/N_2$ may be selected for the second time. In this case, step S1 of forming the adsorption-inhibiting region includes exposing the wafer W to plasma generated from $Cl_2/N_2$ and then exposing the wafer W to plasma generated from $Cl_2$, $N_2$, or $Cl_2/N_2$. In addition, one or more of, for example, flow rate, flow rate ratio, plasma irradiation time, pressure of $Cl_2$, $N_2$, or $Cl_2/N_2$, and RF power may be changed for the first time and the second time.

In step S1 of forming the adsorption-inhibiting region, when plasma is used, the reactivity becomes high and the gas such as $Cl_2$ is easily adsorbed. Therefore, the wafer W is exposed to the plasma generated from $Cl_2$, $N_2$, or $Cl_2/N_2$. However, adsorption of the adsorption-inhibiting gas occurs even if plasma is not used. Therefore, in step S1 of forming the adsorption-inhibiting region, the wafer W may be exposed to an adsorption-inhibiting gas of $Cl_2$, $N_2$, or $Cl_2/N_2$ to form the adsorption-inhibiting region without using plasma. In this case, RF power is not supplied from the RF power supplier 8 to the shower head 3.

(Purge Step S2)

Subsequently, a purge step S2 is performed. In the purge step S2, the gas remaining in the processing container 1 is removed after step S1 of forming the adsorption-inhibiting region. In the present embodiment, the controller 9 supplies the inert gas (e.g., argon gas) from the gas supplier 5 into the processing container 1 via the shower head 3, and evacuates the interior of the processing container 1 by the exhauster 4. As a result, the adsorption-inhibiting gas remaining in the processing container 1 is discharged together with the inert gas. The purge step S2 may be omitted.

(Step S3 of Adsorbing Silicon-Containing Gas)

Subsequently, step S3 of adsorbing the silicon-containing gas is performed. In step S3 of adsorbing the silicon-containing gas, by supplying a silicon-containing gas to the wafer W, the silicon-containing gas is adsorbed in the region other than the adsorption-inhibiting region to form a silicon (Si)-containing layer. In the present embodiment, the controller 9 supplies a silicon-containing gas (e.g., DCS) from the gas supplier 5 into the processing container 1 via the shower head 3. The silicon-containing gas is not adsorbed so much in the region where chlorine and/or nitrogen having an adsorption-inhibiting function is present, but is adsorbed in a large amount in the region in which chlorine and/or nitrogen are not present. Therefore, a large amount of silicon-containing gas is adsorbed near the bottom portion in the trench, and the amount of silicon-containing gas adsorbed on the surface of the wafer W and at the upper portion in the trench is relatively less than the amount of silicon-containing gas adsorbed in the vicinity of the bottom portion. That is, the silicon-containing gas is adsorbed at a high density in the vicinity of the bottom portion in the trench, and the silicon-containing gas is adsorbed at a low density at the upper portion in the trench and on the surface of the wafer W.

In the present disclosure, in step S3 of adsorbing the silicon-containing gas, the dose amount of the silicon-containing gas to be supplied is controlled to be equal to or greater than the adsorption saturation amount of the silicon-containing gas adsorbed on the wafer W on which the adsorption-inhibiting region is not formed. The adsorption saturation amount at which the amount of the silicon-containing gas adsorbed on the wafer W is saturated refers to the maximum value in the amount of the silicon-containing gas at which the precursor of the silicon-containing gas is capable of being adsorbed to an adsorption site on the surface of the wafer W including the recess.

Figure 5:
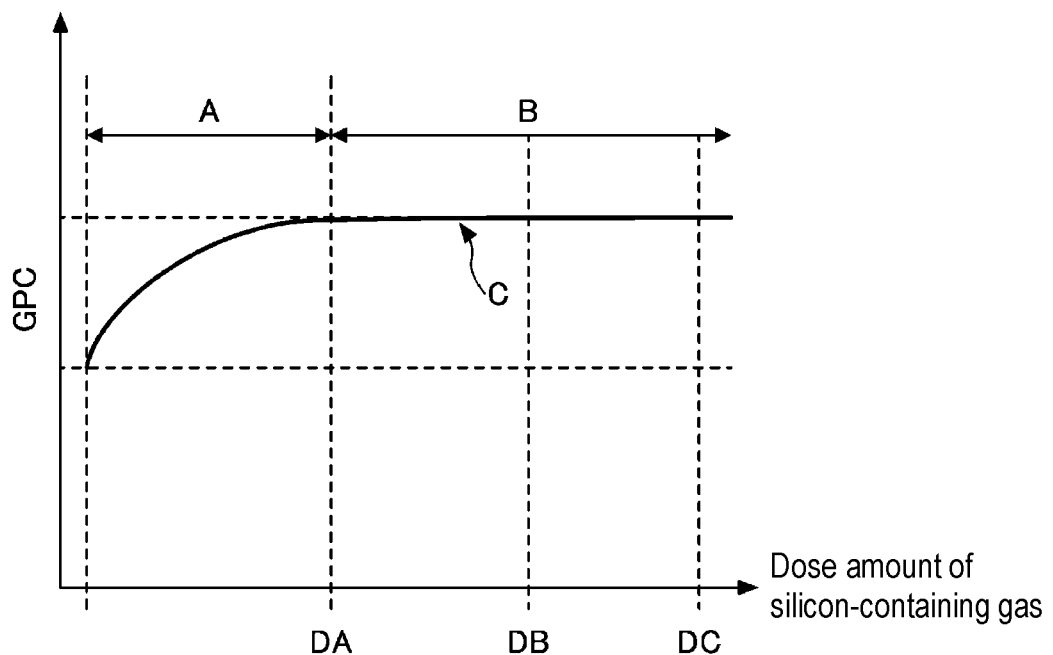
FIG. 5 is a diagram for explaining an example of an adsorption saturation curve of a silicon-containing gas.

FIG. 5 is a view for explaining an example of an adsorption saturation curve C of a silicon-containing gas. The horizontal axis of FIG. 5 represents the dose amount of a silicon-containing gas, and the vertical axis represents a GPC, that is, a film formation amount per cycle (Å/cycle). The GPC is an index of C, which is the film formation rate of a film.

In the example of FIG. 5, in the period A, as the dose amount increases, the GPC increases and the film formation rate increases. When the dose amount exceeds a certain amount DA, the GPC becomes almost constant. At this time, it is considered that a precursor of a saturation amount (adsorption saturation amount) is adsorbed on the surface of the wafer W. Therefore, in the period B in which the dose amount exceeds the certain amount DA, the GPC does not increase even if the dose amount increases. Therefore, in the region in which the dose amount is DA or more, the GPC hardly changes even if the dose amount increases to DB and DC. At this time, the doze amounts of the silicon-containing gas have a relationship of DA<DB<DC.

That is, when the silicon-containing gas is supplied to a wafer W in which no adsorption-inhibiting region is formed, the adsorption saturation curve C shows that when a silicon-containing gas of an adsorption saturation amount (a precursor of an adsorption saturation amount) is adsorbed on the wafer W, it is impossible to significantly change the film thickness distribution any more even if the silicon-containing gas is further supplied. The adsorption saturation curve draws a curve that differs depending on the type of a silicon-containing gas, but in each case, in the period in which the dose amount exceeds a certain amount after the period in which the dose amount increases, the adsorption saturation curve becomes a curve in which the GPC hardly increases even if the dose amount increases. There is a case in which the GPC continues to rise slightly, but in that case, in the curve of dependence of the mean GPC of the entire film on the dose amount (Langmuir), the dose amount twice as much as an inflection point (the dose amount at which the value of a function obtained through second-order differentiation of the GPC with the Langmuir becomes 0) is determined as a saturated adsorption amount. Adsorption saturation curves depending on types of silicon-containing gases are set for each of the types of silicon-containing gases and stored in advance in a storage such as a RAM of the controller 9.

In step S3 of adsorbing the silicon-containing gas, the dose amount of the silicon-containing gas to be supplied is controlled to be equal to or greater than the adsorption saturation amount of the silicon-containing gas to be adsorbed on a wafer W in which no adsorption-inhibiting region is formed.

For example, an adsorption saturation curve according to the type of a silicon-containing gas to be supplied is selected from among the adsorption saturation curves stored in the storage. Then, the doze amount of the silicon-containing gas may be controlled for each of the silicon-containing gases to be adsorbed, based on an adsorption saturation curve selected from the adsorption saturation curves stored in the storage in advance for each gas type of silicon-containing gases adsorbed on a wafer W in which no adsorption-inhibiting region is formed.

(Purge Step S4)

Returning to step S4 in FIG. 3, a purge step S4 is subsequently performed. In the purge step S4, the silicon-containing gas remaining in the processing container 1 is removed after step S3 of adsorbing the silicon-containing gas. In the present embodiment, the controller 9 supplies an inert gas (e.g., argon gas) from the gas supplier 5 into the processing container 1 via the shower head 3, and evacuates the interior of the processing container 1 by the exhauster 4. As a result, the silicon-containing gas remaining in the processing container 1 is discharged together with the inert gas. The purge step S4 may be omitted.

(Nitriding Step S5)

Subsequently, a nitriding step S5 is performed. In the nitriding step S5, a silicon nitride film is formed by exposing the wafer W to plasma generated from a nitrogen-containing gas so that the plasma reacts with the silicon-containing layer formed on the surface of the wafer W and in the trench. The controller 9 supplies, for example, ammonia gas as the nitrogen-containing gas from the gas supplier 5 into the processing container 1 via the shower head 3, and then supplies RF power to the shower head 3 by the RF power supplier 8. In the processing container 1, plasma is generated from ammonia gas, and active species for nitriding are supplied to the surface of the wafer W and into the trench. The active species reacts with the silicon-containing layer formed in the trench, and a molecular layer of a silicon nitride film is formed as a reaction product. Here, since a large amount of the silicon-containing layer is formed in the vicinity of the bottom portion in the trench, a large amount of silicon nitride film is formed in the vicinity of the bottom portion in the trench.

In the nitriding step S5, when plasma is used, the reactivity becomes high and the nitrogen-containing gas is easily adsorbed. Therefore, a silicon nitride film is formed by exposing the wafer W to plasma generated from the nitrogen-containing gas so that the plasma reacts with the adsorbed silicon-containing gas. However, gas adsorption occurs even if plasma is not used. Therefore, in the nitriding step S5, the silicon-containing layer may be nitrided by exposing the wafer W to a nitrogen-containing gas without using plasma. In this case, RF power is not supplied from the RF power supplier 8 to the shower head 3.

(Purge Step S6)

Subsequently, a purge step S6 is performed. In the purge step S6, the nitrogen-containing gas remaining in the processing container 1 after the nitriding step S5 is removed. In the present embodiment, the controller 9 supplies an inert gas (e.g., argon gas) from the gas supplier 5 into the processing container 1 via the shower head 3, and evacuates the interior of the processing container 1 by the exhauster 4. As a result, the nitrogen-containing gas remaining in the processing container 1 is discharged together with the inert gas. The purge step S6 may be omitted.

(Determination Step S7)

Subsequently, in a determination step S7, the controller 9 determines whether or not the number of repetitions from step S1 of forming the adsorption-inhibiting region to the purge step S6 has reached the set number of times. The set number of times is determined, for example, depending the shape of a silicon nitride film to be formed. When it is determined in the determination step S7 that the number of repetitions has reached the set number of times, the process is terminated. Meanwhile, when it is determined in the determination step S7 that the number of repetitions has not reached the set number of times, the process returns to step S1 of forming the adsorption-inhibiting region.

As described above, according to the film forming method of the embodiment, step S1 of forming the adsorption-inhibiting region to the purge step S6 are repeated, so that a silicon nitride film is deposited from the bottom surface side of the trench in the state in which the opening of the trench is not closed. Then, it is possible to form a silicon nitride film having a high bottom-up property without blocking the opening while forming a V-shaped cross section. As a result, it is possible to embed a high-quality silicon nitride film in a trench without generating a void.

In addition, according to the film forming method according to the embodiment, in step S3 of adsorbing the silicon-containing gas, the dose amount of the silicon-containing gas is controlled to be equal to or greater than the adsorption saturation amount of a silicon-containing gas to be adsorbed on a wafer W on which no adsorption-inhibiting region is formed. This makes it possible to increase a GPC as described later so that improvement in productivity can be achieved. As a result, it is possible to achieve both improvement in embedding performance and improvement in productivity.

The purge steps S2, S4, and S6 may be omitted, and the cycle including the step of forming the adsorption-inhibiting region, the step of adsorbing the silicon-containing gas, and the step of forming the silicon nitride film may be repeated the set number of times.

Figure 6:
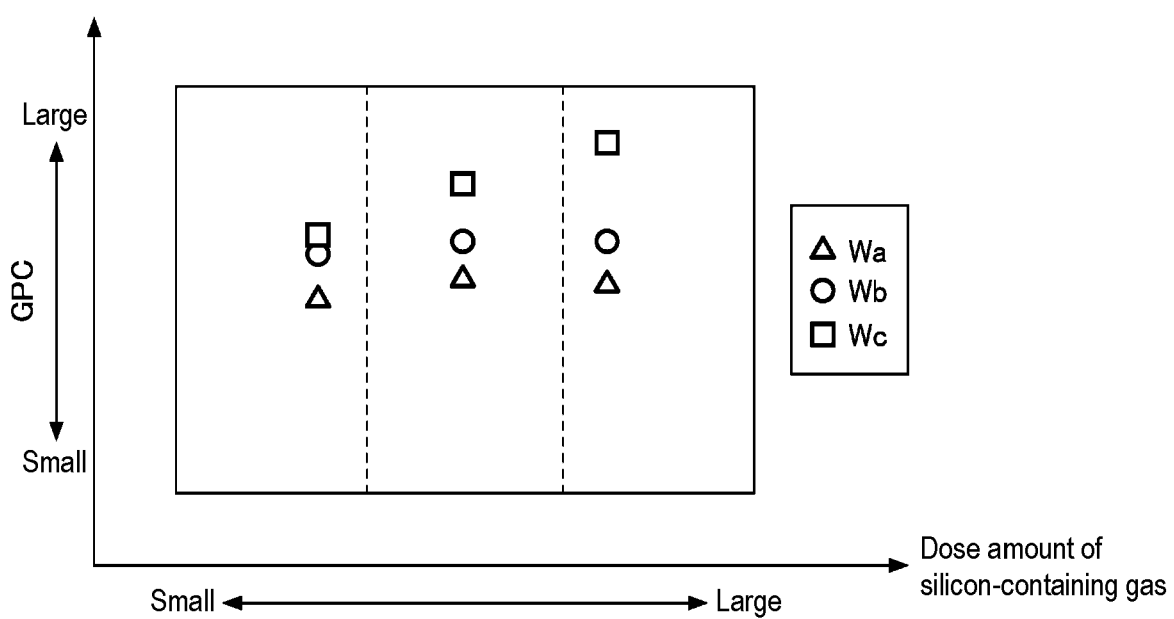
FIG. 6 is a diagram showing the relationship between a dose amount of a silicon-containing gas and a GPC due to a difference in pattern shape.
Figure 7:
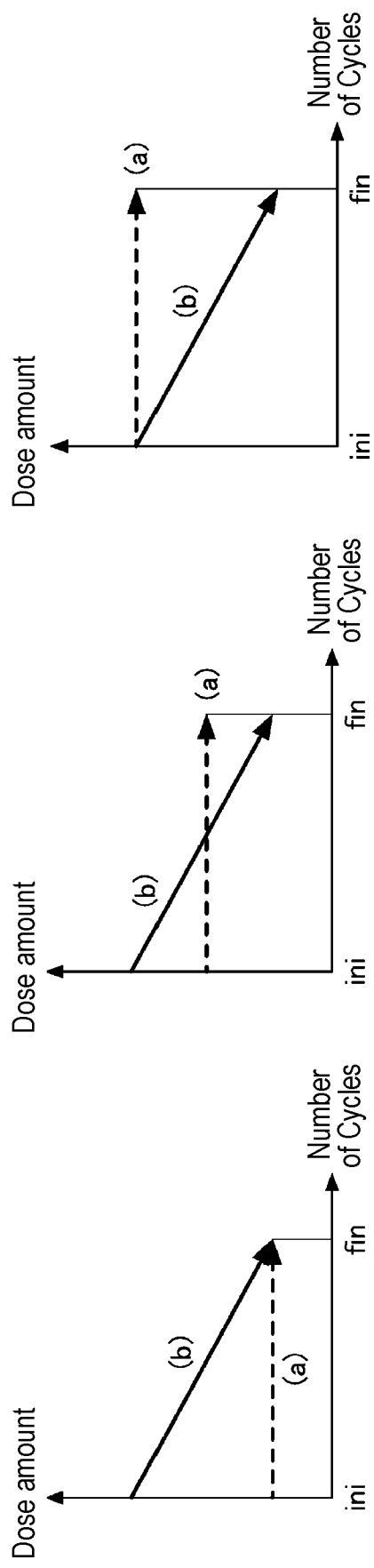
FIG. 7 is a diagram showing examples of the relationship between the number of cycles and a dose amount.

In the step of adsorbing the silicon-containing gas, the dose amount of the silicon-containing gas may be changed depending on the number of the cycles. For example, the dose amount of the silicon-containing gas may increase as the number of cycles increases. For example, the dose amount of the silicon-containing gas may decrease as the number of cycles increases. FIG. 6 is a diagram showing the relationship between a dose amount of a silicon-containing gas and a GPC due to a difference in pattern shape of a wafer. Wa is a flat wafer on which a pattern is not formed, Wb is a wafer having a pattern having a small aspect ratio, and Wc is a wafer having a pattern having a large aspect ratio. In FIG. 6, the GPC and the dose amount of a silicon-containing gas change depending on a pattern shape of a wafer. Therefore, the dose amount of the silicon-containing gas is changed depending on the number of cycles. For example, instead of supplying a constant dose amount during the cycle as shown in (a) of three graphs of FIG. 7, the dose amount of the silicon-containing gas from the initial stage of film formation (ini) to the completion of film formation (fin) is gradually reduced depending on the number of cycles as shown in (b) of three graphs of FIG. 7. This makes it possible to improve the GPC even if the surface area of the wafer W decreases as the film formation progresses and the dose amount required for saturated adsorption changes due to a microloading effect. In addition, this makes it possible to expect the effects of improving productivity and suppressing the consumption of a silicon-containing gas.

As described above, according to the film forming method and the film forming apparatus of the present embodiment, it is possible to achieve both improvement of embedding performance and improvement of productivity in embedding in a recess by using adsorption inhibition.

[Example of Experimental Results]

Figure 8:
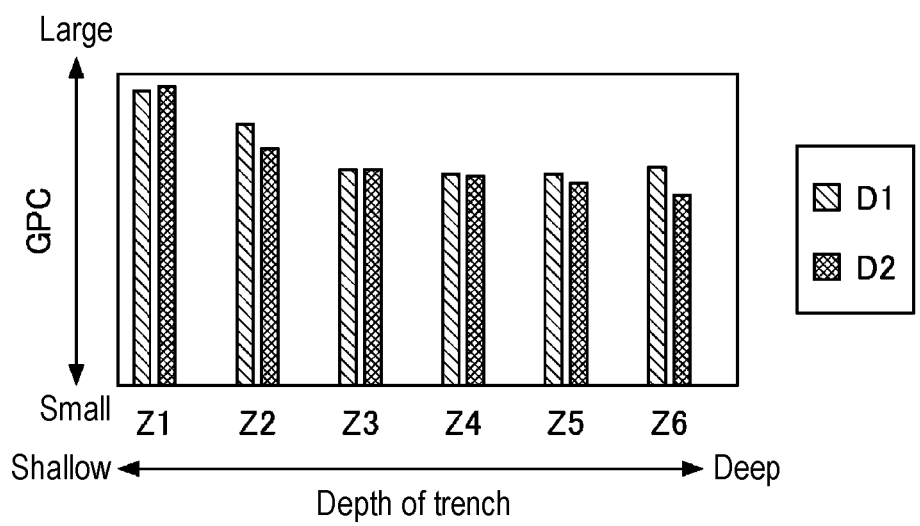
FIG. 8 is a diagram showing the experimental results of GPCs of a silicon nitride film when there is no adsorption inhibition.

FIG. 8 shows the experimental results of GPCs for respective depths of a trench when a silicon-containing gas is supplied to a wafer W in which the adsorption-inhibiting region is not formed. FIG. 8 represents changes in GPC depending on the depth of a trench when the dose amount (Langmuir) of a silicon-containing gas is controlled to D1 and D2 (D1<D2).

In FIG. 8, among the positions Z1 to Z6, the position Z1 is the shallowest position, that is, the position of the upper portion in the trench, and the position Z6 is the deepest position, that is, the position of the lower portion in the trench. As shown in FIG. 8, the GPCs were almost the same at respective depths of the positions Z1 to Z6 regardless of the difference in the dose amounts D1 and D2. That is, as shown in FIG. 8, even if the dose amount increased from D1 to D2, the GPC did not increase. From this, it has been found that the dose amount is saturated and adsorbed at least at a value of D1 or less. In the following, it is assumed that the minimum value of the dose amount required for saturated adsorption is D1 when a silicon-containing gas is supplied to a wafer W on which no adsorption-inhibiting region is formed.

Figure 9:
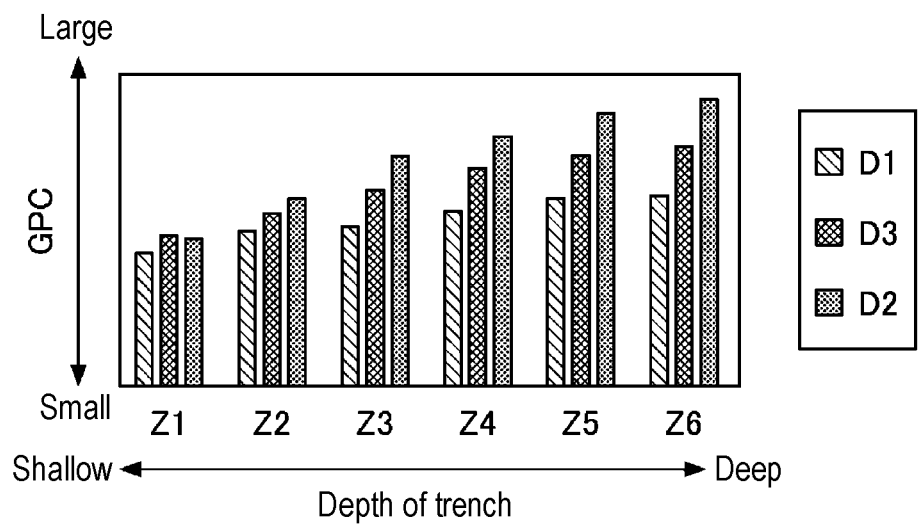
FIG. 9 is a diagram showing the experimental results of GPCs of a silicon nitride film when there is adsorption inhibition.

Next, the experimental results of GPCs for respective depths of a trench when a silicon-containing gas is supplied to a wafer W in which an adsorption-inhibiting region is formed are described. FIG. 9 shows the experimental results of GPCs for respective depths of a trench when a silicon-containing gas is supplied to a wafer W in which an adsorption-inhibiting region is formed. FIG. 9 represents changes in GPC depending on the depth in the trench when the dose amount (Langmuir) of the silicon-containing gas was controlled to D1, D2, and D3 (D1<D3<D2) is shown.

In FIG. 9, when the silicon-containing gas was supplied to the wafer W in which an adsorption-inhibiting region was formed, the GPC for each depth of the trench was increased by controlling the dose amount of the silicon-containing gas to a dose amount D3 that is equal to or larger than the dose amount D1 of the silicon-containing gas required for saturated adsorption when no adsorption-inhibiting region is formed. In addition, when the dose amount of the silicon-containing gas was controlled to the dose amount D2 larger than the dose amount D3, the GPC for each depth in the trench was further increased. It is considered that since the silicon-containing gas was difficult to be adsorbed in adsorption regions (the regions where Si can be adsorbed), such as NH groups existing on the inner surface of the trench, due to the influence of the adsorption-inhibiting gas supplied when forming an adsorption-inhibiting region, the Si-containing gas was not saturated with the original supply amount when the Si-containing gas was supplied, and thus a larger supply amount was required.

From the foregoing, the inventors have found that the dependence of GPC on a dose amount varies between the case where an adsorption-inhibiting region is formed and the case where no adsorption-inhibiting region is formed. Therefore, in the film forming method according to the present embodiment, in the step of supplying a silicon-containing gas to a wafer W after the adsorption-inhibiting step, the dose amount of the silicon-containing gas is set to an amount equal to or greater than the adsorption saturation amount of the silicon-containing gas when the silicon-containing gas is supplied to and adsorbed on a wafer W on which no adsorption-inhibiting region is formed. This makes it possible to increase a GPC so that productivity can be improved.

FIG. 10 is a diagram showing GPCs obtained by normalizing all of the dose amounts D1, D2, and D3 shown in FIG. 9 at the position Z6. According to this, in the silicon-containing gas supply step after the adsorption-inhibiting step, the dose amount is set to be equal to or greater than D1, which is the minimum value of the adsorption saturation amount of the silicon-containing gas when the silicon-containing gas is supplied to and adsorbed on a wafer W on which no adsorption-inhibiting region is formed.

This makes it possible to increase the GPC so that productivity can be improved. In addition, the effect of improving the embedded shape is also obtained. That is, according to FIG. 10, the GPC at the upper portion in the trench (the position where the depth of the trench is shallow) is smaller than the GPC at the bottom portion (the position where the depth of the trench is deep) in the trench. From this result, even when the dose amount was controlled to any of D1, D2, and D3, it was possible to control the cross section of a silicon nitride film embedded in the trench in a V shape, to improve embedding performance, and to eliminate voids. That is, it is possible to form a silicon nitride film having a high bottom-up property. However, when the dose amount was set be the largest as D2 among D1, D2, and D3, the difference between the GPCs at the upper portion and the bottom portion in the trench was the largest and the embedded shape was most improved.

It should be considered that the film forming method and the film forming apparatus according to the embodiments disclosed herein are exemplary in all aspect and are not restrictive. The embodiments may be modified and improved in various forms without departing from the scope and spirit of the appended claims. The matters described in in the plural embodiments may take other configurations within a non-contradictory range, and may be combined within a non-contradictory range.

In the above-described embodiments, the cases where the adsorption-inhibiting gas is chlorine gas ($Cl_2$), nitrogen gas ($N_2$), or a mixed gas of chlorine gas and nitrogen gas ($Cl_2/N_2$) have been described, but the present disclosure is not limited thereto.

The adsorption-inhibiting gas includes a halogen gas and a non-halogen gas. Examples of the halogen gas include fluorine gas ($F_2$), chlorine gas ($Cl_2$), and hydrogen fluoride gas (HF). Examples of the non-halogen gas include nitrogen gas ($N_2$) and a silane coupling agent. Examples of the silicon-containing gas include gases including halogens, such as chlorine (Cl), bromine (Br), and iodine (I), and silicon (Si).

For example, the step of forming the adsorption-inhibiting region includes at least one of exposure to plasma generated from a halogen gas, exposure to plasma generated from a non-halogen gas, exposure to a halogen gas, and exposure to a non-halogen gas. Examples of the adsorption-inhibiting gas include, as the halogen gas, a fluorine gas ($F_2$), chlorine gas ($Cl_2$), hydrogen fluoride gas (HF), and the like. Examples of the non-halogen gas include nitrogen gas ($N_2$) and a silane coupling agent.

The step of forming the adsorption-inhibiting region includes exposure to a halogen gas or plasma generated from the halogen gas, and then exposure to a non-halogen gas or plasma generated from the non-halogen gas.

The step of forming the adsorption-inhibiting region includes exposure to a non-halogen gas or plasma generated from the non-halogen gas, and then exposure to a halogen gas or plasma generated from the halogen gas.

The step of forming the adsorption-inhibiting region includes repeating, one or more times, exposure to a halogen gas or plasma generated from the halogen gas, and exposure to a non-halogen gas or plasma generated from the non-halogen gas.

The step of forming the adsorption-inhibiting region includes exposure to a mixed gas of a halogen gas and a non-halogen gas, exposure to plasma generated from the mixed gas of the halogen gas and the non-halogen gas, exposure to a halogen gas or a non-halogen gas, and exposure to plasma generated from the halogen gas or the non-halogen gas. The halogen gas is chlorine gas, and the non-halogen gas is nitrogen gas.

The silicon-containing gas is not limited to dichlorosilane gas (DCS). Examples of the silicon-containing gas include gases containing halogens such as chlorine (Cl), bromine (Br), iodine (I), and silicon (Si).

The nitrogen-containing gas is not limited to ammonia gas ($NH_3$). For example, examples of the nitrogen-containing gas include ammonia gas ($NH_3$), hydrazine gas ($N_2H_2$), nitrogen gas ($N_2$), and the like, and these may be combined. For example, the nitrogen-containing gas may contain hydrogen gas ($H_2$).

In the above-described embodiments, the cases where the purge gas used in the purge steps S2, S4, and S6 is argon gas (Ar) have been described, but the present disclosure is not limited thereto. For example, examples of the purge gas include argon gas (Ar), nitrogen gas ($N_2$), and the like, and these may be combined. Further, exhaust may be performed in a vacuum state without using the purge gas.

In the above-described embodiments, the cases where the film forming apparatus is a capacitively coupled plasma apparatus have been described, but the present disclosure is not limited thereto. For example, the film forming apparatus may be a plasma apparatus using inductively coupled plasma, surface wave plasma (microwave plasma), magnetron plasma, remote plasma, or the like as a plasma source may be used.

In the above-described embodiments, the cases where the film forming apparatus is a single-wafer-type apparatus for processing wafers one by one have been described, but the present disclosure is not limited thereto. For example, the film forming apparatus may be a batch-type apparatus that processes plural wafers at once. In addition, for example, the film forming apparatus may be a semi-batch-type apparatus that causes plural wafers placed on a rotary table within a processing container to revolve such that the wafers sequentially pass through a region to which a first gas is supplied and a region to which a second gas is supplied, thereby processing the wafers. Furthermore, for example, the film forming apparatus may be a multi-single-wafer-type apparatus that includes plural stages in a single processing container.

According to an embodiment of the present disclosure, in embedding in a recess through adsorption inhibition, it is possible to achieve both improvement in embedding performance and improvement in productivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method of forming a film in a recess formed on a surface of a substrate, the film forming method comprising:
   repeating a cycle including:
      forming an adsorption-inhibiting region by supplying an adsorption-inhibiting gas to the substrate;
      adsorbing a silicon-containing gas to a region other than the adsorption-inhibiting region by supplying the silicon-containing gas to the substrate; and
      forming a silicon nitride film by exposing the substrate to a nitrogen-containing gas so that the nitrogen-containing gas reacts with the adsorbed silicon-containing gas,
   wherein in the adsorbing the silicon-containing gas, a dose amount of the silicon-containing gas to be supplied is controlled to be equal to or greater than an adsorption saturation amount of the silicon-containing gas to be adsorbed on the substrate on which no adsorption-inhibiting region is formed, and
   wherein the dose amount of the silicon-containing gas is changed depending on a number of times the cycle is to be repeated.

2. The film forming method of claim 1, wherein the dose amount of the silicon-containing gas is controlled for the silicon-containing gas to be adsorbed, based on an adsorption saturation curve previously stored in a storage for each type of silicon-containing gases adsorbed on the substrate on which no adsorption-inhibiting region is formed.

3. The film forming method of claim 2, wherein the adsorbing the silicon-containing gas includes reducing the dose amount of the silicon-containing gas depending on the number of times the cycle is to be repeated.

4. The film forming method of claim 3, wherein the forming the silicon nitride film includes exposing the substrate to plasma generated from the nitrogen-containing gas so that the plasma reacts with the adsorbed silicon-containing gas.

5. The film forming method of claim 4, wherein the forming the adsorption-inhibiting region includes exposing the substrate to plasma generated from the adsorption-inhibiting gas.

6. The film forming method of claim 2, wherein the forming the silicon nitride film includes exposing the substrate to plasma generated from the nitrogen-containing gas so that the plasma reacts with the adsorbed silicon-containing gas.

7. The film forming method of claim 6, wherein the forming the adsorption-inhibiting region includes exposing the substrate to plasma generated from the adsorption-inhibiting gas.

8. The film forming method of claim 2, wherein the forming the adsorption-inhibiting region includes exposing the substrate to plasma generated from the adsorption-inhibiting gas.

9. The film forming method of claim 1, wherein the forming the silicon nitride film includes exposing the substrate to plasma generated from the nitrogen-containing gas so that the plasma reacts with the adsorbed silicon-containing gas.

10. The film forming method of claim 1, wherein the forming the adsorption-inhibiting region includes exposing the substrate to plasma generated from the adsorption-inhibiting gas.

* * * * *